United States Patent [19]

Göbl et al.

[11] Patent Number: 5,357,401
[45] Date of Patent: Oct. 18, 1994

[54] ELECTRONIC CIRCUIT ARRANGEMENT

[75] Inventors: Christian Göbl, Nürnberg; Dieter Löwer, Schwabach, both of Fed. Rep. of Germany

[73] Assignee: Export-Contor Aussenhandelsgesellschaft mbH, Nürnberg, Fed. Rep. of Germany

[21] Appl. No.: 956,808

[22] Filed: Oct. 5, 1992

[30] Foreign Application Priority Data

Oct. 4, 1991 [DE] Fed. Rep. of Germany ....... 4132947

[51] Int. Cl.$^5$ .............................................. H05K 7/20
[52] U.S. Cl. ..................... 361/712; 361/749
[58] Field of Search ............. 174/16.3, 254, 258–259; 165/80.3, 185; 361/383, 386–389, 397, 398; 428/209, 901

[56] References Cited

U.S. PATENT DOCUMENTS

| | | |
|---|---|---|
| 3,952,231 | 4/1976 | Davidson et al. .................. 361/386 |
| 4,180,828 | 12/1979 | Schermer et al. . |
| 4,858,073 | 8/1989 | Gregory .............................. 361/388 |

FOREIGN PATENT DOCUMENTS

| | | |
|---|---|---|
| 0215462 | 3/1987 | European Pat. Off. . |
| 0219627 | 4/1987 | European Pat. Off. . |
| 0257466 | 3/1988 | European Pat. Off. . |
| 0381849 | 8/1990 | European Pat. Off. . |
| 3001613 | 7/1981 | Fed. Rep. of Germany . |
| 3505313 | 5/1986 | Fed. Rep. of Germany . |
| 3508456 | 1/1987 | Fed. Rep. of Germany . |
| 3421672 | 1/1988 | Fed. Rep. of Germany . |
| 3628556 | 4/1988 | Fed. Rep. of Germany . |
| 3736671 | 6/1989 | Fed. Rep. of Germany . |
| 8300949 | 3/1983 | PCT Int'l Appl. . |

OTHER PUBLICATIONS

Patent Abstracts of Japan JP-A-30 58 436 (No known date).
IBM Technical Disclosure Bulletin, Band 25, No: 10, Mar. 1, 1983.
IEEE Transactions, Band 13, No: 4, Dec. 1, 1990.

Primary Examiner—Gregory D. Thompson

[57] ABSTRACT

An electronic circuit mounting arrangement includes heat-conducting, electrically insulating and/or conducting pastes (14, 30) as well as flexible conductor plates (16, 28). The utilization and application of these elements make it possible to increase the packing density of the components (22, 32) also in the field of the high-power circuit arrangements. It further provides for a substantial rationalization in the connection technique for an optimization in the means of the contacting procedure. The economic manufacturing, accompanied by a destruction-free partial demountability, permits based on the use of pastes and foils the further mounting of electronic circuit arrangements resulting in an increased circuit density in one circuit unit.

37 Claims, 3 Drawing Sheets

ELECTRONIC CIRCUIT ARRANGEMENT

BACKGROUND OF THE INVENTION

1. Field of the Invention

The invention relates to an electronic circuit arrangement including a cooling component, wherein a thermally conductive and electrically insulating substrate carrier is disposed on the cooling component, wherein at least one power semiconductor component to be cooled is disposed on the substrate carrier, wherein the power semiconductor component is contacted with outer and circuit-conforming internal connection elements through connection surfaces to an electrical connection.

2. Brief Description of the Background Invention Including Prior Art

It is known that during the mounting and assembly of power semiconductor component chips in particular to discrete components but, to an even larger extent, to integrated components, increased attention is to be placed on the elimination of the amounts of heat, formed in case of use during the operation. This problem determines mainly the limits of the upper capacity and dimensioning. It is the object of the endeavors during the conception of novel electronic circuit arrangements to expand these limits.

As a result, the heat transfers to corresponding cooling surfaces are to be considered with special care during the constructive design of the components in addition to the reliable permanent-load and alternating-load electrical connection. Due to an ever increasing number of chips integrated into one single circuit element, the heat transfers to the cooling surfaces are determinant in assuring a long function lifetime.

To this effect, an alternating-load-resistive switchable power semiconductor component in the premounting of its chips to a pressure contact loadable "sandwich" is known from the German Printed Patent document DE-PS 3,421,672. This component offers a low heat resistance in the pressure-contacted mounting arrangement and does therefore possess the prerequisites for a high current loadability for alternating loads and with a good long-time stability.

The technologically sensible combination of a form-locking and integral-jointed connection technique of the individual components, required for the mounting of electronic circuit arrangements, is known in the art. A semiconductor arrangement is described in the German Printed Patent document 3,628,556. The conductor parts are at least in part formed for pressure contacting since in this case an economic possibility is given to exchange individual circuit parts. This is also possible in case of the components described in the German Printed Patent document DE-PS 3,005,313.

A pressure-contacted power semiconductor component is described also in the German Printed Patent Document DE-PS 3,508,456. In this case, as well as in the above recited references, the electrical insulation is achieved with metal oxide ceramic relative to the outer cooling component.

Integral joints of the individual components of an electronic arrangement amongst themselves, in particular the most often applied soldering, have an upper limit of the applicability relative to the size of the soldered surface, as has already been noted in the German Printed Patent document 3,736,671. The differing coefficients of expansion of the components amongst themselves and relative to the metal oxide ceramic employed as insulation layer result in a warping and arching resulting in high shearing forces at the connection positions, in particular in case of changing temperatures.

SUMMARY OF THE INVENTION

1. Purposes of the Invention

It is an object of the present invention to formulate a power semiconductor component without employing metal oxide ceramic and to assure thereby the insulation of the current-conducting components relative to the cooling component accompanied by good heat conductivity.

It is a further object of the present invention to reduce the number of the electrical connection parts.

It is still a further object of the present invention to provide for a higher integration density in the electronic circuit arrangements.

It is yet a further object of the present invention to utilize the advantages of the form-locking connection technique and of the integral joint connection technique in a simple manner also in a combined form.

These and other objects and advantages of the present invention will become evident from the description which follows.

2. Brief Description of the Invention

The present invention provides an electronic circuit arrangement with a cooling component. A thermally conductive and electrically insulating substrate carrier is disposed on the cooling component. At least one power semiconductor component to be cooled is disposed on the substrate carrier. The power semiconductor component is contacted with outer and proper sequenced necessary internal connection elements through connection surfaces to provide an electrical connection. Heat-conductive pastes of defined thickness and geometry are provided in a layer mounting arrangement. Form-stable and heat-resistant flexible foils are provided. The flexible foils are made of organic polymers and are also provided with structured metal laminate layers. Flexible conductor plates including one of a single-layer and a multilayer sequence, alternatingly foil and metal, and including metallic connections between two or more layers by means of metallic breakthroughs, are provided as substrate carrier and connection elements.

The heat-conducting paste can be a layer made of a mixture of suitable organic compounds with a defined portion of fillers. The heat-conducting paste can serve simultaneously as a good electrical insulator.

The paste can be manufactured from an ester oil base including metal oxides as fillers.

A heat-conducting paste can include a mixture of suitable organic compounds with a defined portion of fillers. The fillers can comprise materials which conduct electrical current also in a mixture including the organic carrier substance.

The heat-conducting and electrically conducting paste can be positioned at such points, where said points bring about a galvanic interconnection between respective components in a proper sequence through pressure contact.

The substrate carrier and the connection element can be made of polyimide or polyester in form of flexible foils. Said foils in each case can include at least one metal layer. Said metal layers can be partially structured and properly sequenced.

The partially structured metal layers, present on the flexible foils, can be made of copper and include also a partial coating. The metal layers can have differing layer thicknesses corresponding to electrical requirements.

The partial coating can be made of gold or of silver.

The conductor paths of the structured metal layer of the foils can be constructed to provide an integral joint connection directly to outer current connections.

Contact islands can be provided in the structured metal layers of the foils. Integrally joined and positively engaged connection elements and other components as well as semiconductor and control components can be contacted on the contact islands.

An integral joint can be formed between a metal conductor path and the connection element by solder material and a bonding element. An integral joint can be formed directly between a contact surface of the semiconductor component over a bonding element to the connection element and over a second bonding element to the metal conductor path.

An integral joint can be formed indirectly from the semiconductor component through a first solder material, a metallic intermediate layer, a second solder material to the metal conductor path.

Pressure contacts can be mounted directly between metallizing layer of the foil and connection element or component or indirectly through an electrically conducting paste.

Individual control components can be contacted on both sides with flexible conductor plates formed by the substrate carrier and by the connection element.

The metallic intermediate layer can be formed of molybdenum and coated with a suitable galvanically or currentless metal coating.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings, in which are shown several of the various possible embodiments of the present invention.

DESCRIPTION OF INVENTION AND PREFERRED EMBODIMENT

Figure 1:
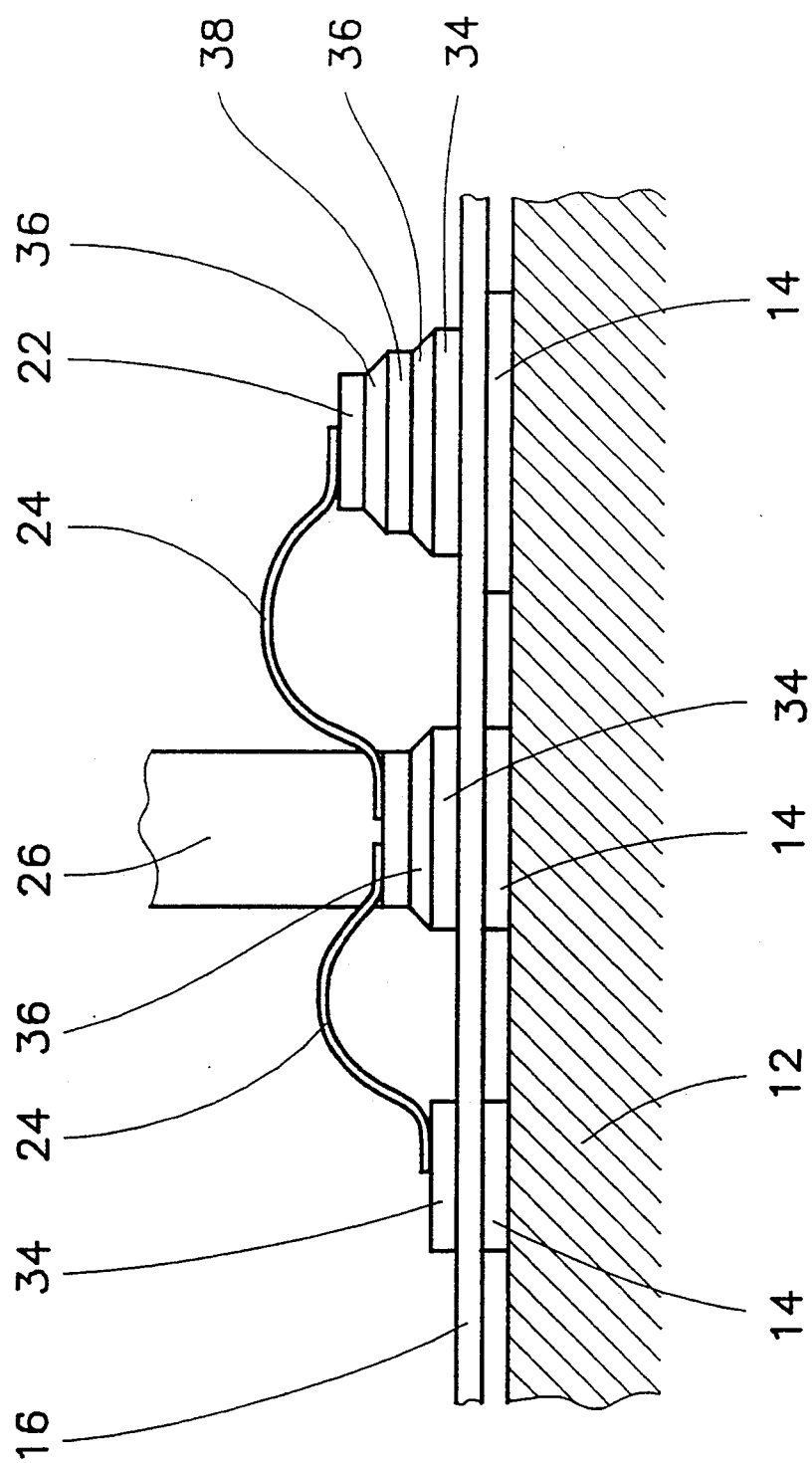
FIG. 1 is a sectional view of a circuit, wherein the invention insulation construction is combined with known connection techniques.

The electronic circuit arrangement according to FIG. 1 includes the following relevant layer construction according to the invention. A paste 14 is applied in the silk-screening method in a uniform thickness and in a contour, predetermined by the screen, on a cooling component 12 on the surface provided for the mounting of the circuit arrangement. The geometry of the cooling component 12 is of no consequence in this case. This paste 14 has the object to provide a good transfer of the heat, generated in the semiconductor body during operation, to the cooling components 12. A bubble-free application of the electrically insulating paste 14 is important for the good lifetime properties. An improvement of the heat conduction can be achieved by admixing pulverized metal oxides, preferably zinc oxide, to the paste, which is preferably produced of organic ester oils. In this case, the portion of the filler can be varied within limits, wherein a higher metal oxide portion improves the heat conduction.

Even in case of operating temperatures repeatedly occurring close to the permissible upper maximum level without bleeding, the paste 14 exhibits the property of remaining permanently elastic, i.e. the paste does not run from the contact point into non-pressurized regions even in case of pressure contacts.

A flexible, foil 16 of organic polymers, preferably polyimide foil or polyester foil, is affixed to this structured and patterned, paste-like layer 14. The per se known foils form in an excellent manner together with the paste-like layer the insulation layer for the current-carrying components, mounted on the insulation layer, relative to the cooling component. The advantage of the utilization of such a foil 16 with the properties of form stability and heat resistance is found in the flexibility of such foils in the regions critical to the mounting arrangement of electronic circuit arrangements.

The advantage in this case is that an expansion-conditional displacement and shifting of the layers amongst themselves is possible without tension even in case of previously imposed pressure as compared to any rigid insulation layer, regardless of whether same is manufactured of inorganic composite materials, for example metal oxides, or organic composite materials, for example glass-fabric epoxy resin.

The per se given poorer heat transmission values of the foil can be compensated by various methods relative to the good heat conductivity value of ceramic. The dielectric strength which is substantially better in case of these foils as compared to ceramic, can be maintained based on the addition of fillers prior to the formation of the foil, while the heat conductivity is increased. The foils can be formed substantially thinner than ceramic and it is possible to employ this thinner film including two or several layers, where preferably a copper foil is laminated between said layers. Finally, it is also possible in certain cases to form a layer sequence out of foils with interdisposed paste layers, wherein these pastes should then exhibit electrically conducting metals as filler, since the heat conductivity is then better than upon admixture of metal oxides. Flexible multi-layer foils, formed in such a manner, having the thickness required by the dielectric strength, are not separately shown in the figures, but are designated with the summary designation 16.

A conductor path 34 formed as a metal surface in the form of three islands is illustrated in the further construction in FIG. 1. These islands of the circuit section are, spatially considered, the circuit configuration of the structured and patterned metal coating, where the metal coating preferably is made of copper based on the excellent electrical and heat-conductive properties, wherein the copper coating is structured in a conventional manner suitable for circuitry prior to the mounting in the electronic circuit arrangement, however after the laminating onto the flexible foil. The series of conductors, soldering islands and bonding islands as well as the position locations for the future pressure contact allow during interaction a simple and space-saving arrangement accompanied by a high integration degree of the components required for the circuit. The thickness of the metal coating can be defined differently based on the required electrical power intake.

The further mounting arrangement in FIG. 1 includes the integral-joint attachment of connection elements 24 by bonding, or the direct or indirect attachment of components 22 onto the conductor path 34 formed as metal coating, where the indirect attachment can be formed by a metallic layer, for example a molybdenum layer 38. The component 22 can be connected, for example by integral-joint bonding, to connection elements 24 on the side facing away from the cooling component 12, wherein the connection elements 24 themselves are joined in an identical manner integrally to other current-carrying connection elements 26.

Figure 2:
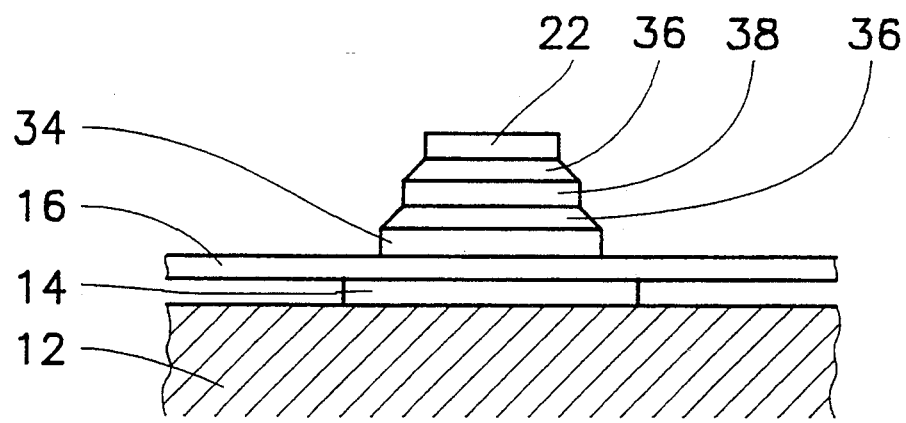
FIG. 2 illustrates a detail view of the layer sequences between the cooling component and the power semiconductor component in an integral-joint mounting arrangement.

The essential features of the circuit mounting arrangement with integral joints are illustrated in FIG. 2. The power semiconductor component 22 is soldered, for example, onto a molybdenum layer 38 and is thereby forming a first soldering surface 36. The molybdenum layer 38 in turn is soldered to the second soldering surface 36 off the patterned metal coating of the flexible foil 16. In this way, there is provided a good heat transfer from the component 22 to, for example, the metal conductor path 34 of the foil 16. The foil 16 and the paste 14 provide the required good heat dissipation to the cooling component 12.

Figure 3:
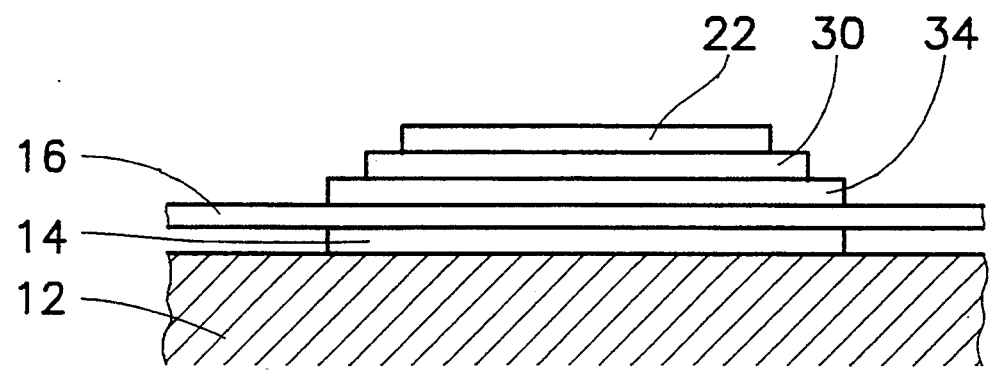
FIG. 3 illustrates the mounting arrangement of a semiconductor chip in a form-locking mounting method.

At suitable points of the electronic circuit arrangement it is possible to simplify the mounting arrangement according to FIG. 2 by the formation of pressure contacts. This is achieved in that, as illustrated in FIG. 3, the paste 14 and the foil 16 with the metal conductor path 34 are mounted in the already described manner onto the cooling component 12. An electrically conductive paste 30 is now applied in a suitable manner by dots or uniformly over surface onto the contact surface of the metal conductor path 34. This paste 30 is heat-conducting as in the case of the above described paste. However, the paste 30 contains metals, such as for example aluminum, silver, or carbon, in the form of graphite, as filler admixture such that a circuit-suitable electrical current flow of little resistance or practically no resistance is possible from the component 22, placed on the paste 30, to the metal conductor path 34 formed as metal coating of the flexible foil 16.

Figure 4:
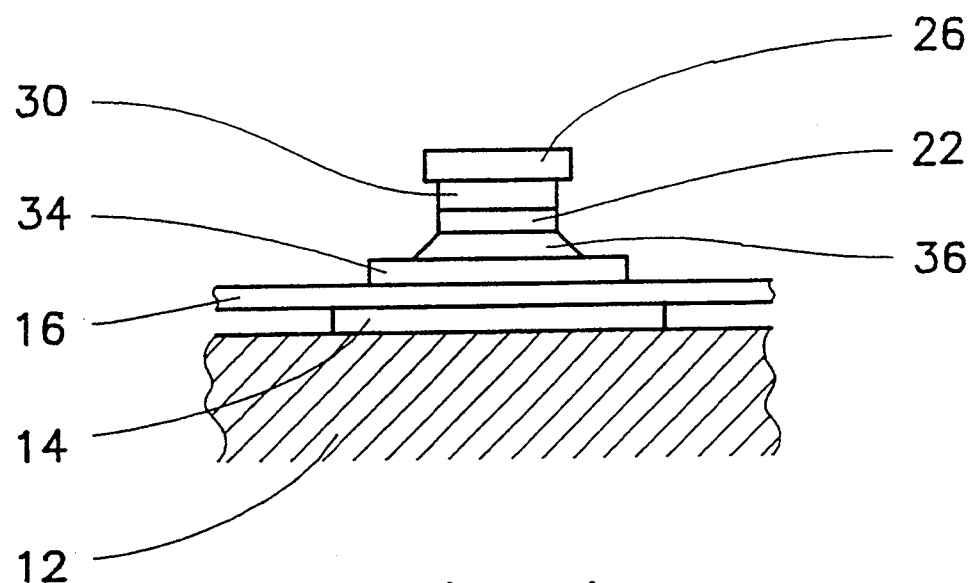
FIG. 4 illustrates an analog detail with pressure contacted connection element.

An invention circuit arrangement is also illustrated in an exemplified embodiment in the circuit section of FIG. 4. The paste 14 and the foil 16 are again positioned on the cooling component 12. In this representation as well, the foil 16 includes at least one metal layer for the attachment of components on a conductor path 34 or metal coating. The component 22 is disposed integrally joined by a soldering surface 36 to the conductor path 34 or metal coating. The contacting of the side of the component 22, facing away from the cooling component 12, with the connection part 26 is performed by means of heat-conducting paste 30, where the paste is rendered electrically conductive by silver as filler.

Figure 5:
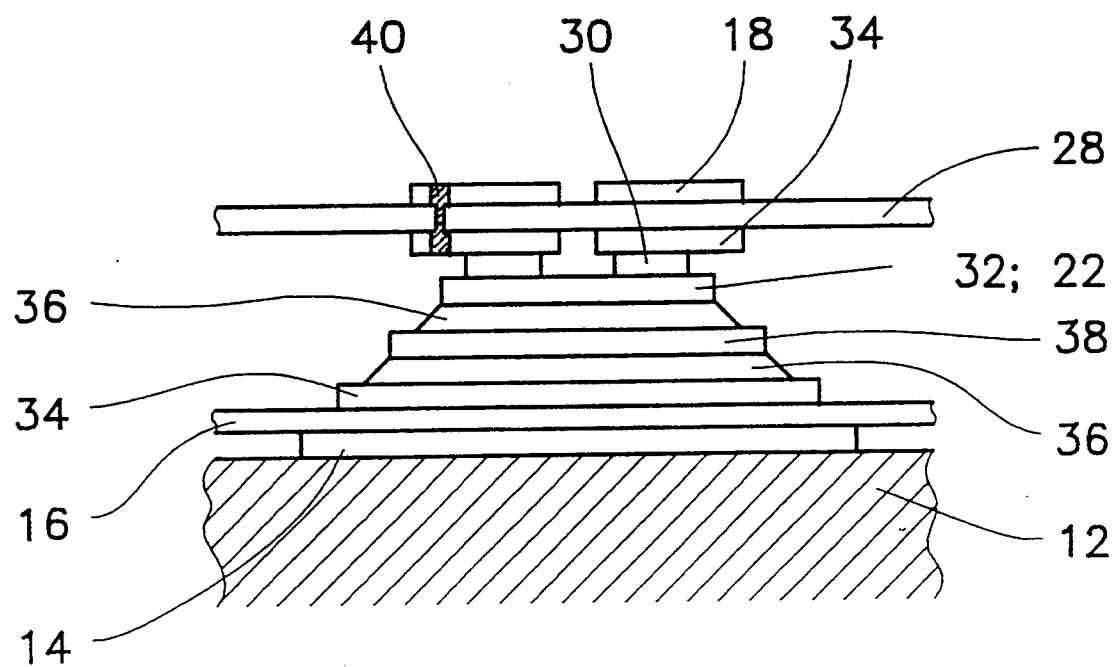
FIG. 5 is a schematic detailed view of a second flexible conductor plate.

FIG. 5 illustrates a schematic view of a circuit section, where two flexible foils have been mounted. The mounting arrangement up to the semiconductor chip is already illustrated in connection with the description of FIGS. 1 to 4. The side of the component 22, 32, facing away from the cooling component 12, can pressure contact a second flexible foil 28 directly through a conductive paste 30, as already described, and a metal conductor path 34 or metal coating, in particular in application cases of control components 32 having a low current load and subsequently a low heat load, but also in case of certain power semiconductor components 22. By means of through-hole platings 40, electrical connections can be realized on both sides of the foil 28 for a crossover-free wiring at a high packing density. It is also possible in this case to realize the circuit-conforming electrical requirements of high current density by a different dimensioning of the illustrated upper metal coating 18.

Differences in the planes of the individual mounting islands, as can occur during the mounting assembly of the most differing elements of the circuit arrangement, can be advantageously compensated by the application of this second flexible foil 28. Furthermore, the geometry of the upper foil 28, as well as the lower foil 16, can be structured and formed such, by punching or by milling, that recesses, curvatures, and break-throughs corresponding to any possible geometrical requirements, can be incorporated and that thus precisely fitting foils can be produced for any electronic circuit arrangement.

The invention application of flexible circuit boards in power semiconductor components opens a novel dimension to increase the packing density, an economic mass production paired with the advantages of the non-destructive demounting of partial region of the circuit and a correspondingly economically advantageous remounting or, respectively, secondary use of individual circuit elements.

The soldering technique and the pressure contacting are not described in connection with the present invention. State of the art procedures and methods are used to complete the electronic circuit arrangement. The screening and shielding and the hermetics are also of no consequence in connection with the representation of the inventive thought.

It will be understood that each of the elements described above, or two or more together, may also find a useful application in other types of electronic circuits differing from the types described above.

While the invention has been illustrated and described as embodied in the context of a mounting arrangement of individual layers and components to form an electronic circuit arrangement, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. An electronic circuit arrangement comprising
   a cooling component (12);
   a heat-conductive paste layer (14) of defined geometry disposed on the cooling component;
   a thermally conductive and electrically insulating substrate carrier (16), wherein the substrate carrier is a flexible foil made of organic polymers and provided with structured metal laminate layers, forming a multilayer structure and wherein the substrate carrier is disposed on the heat-conductive paste layer (14);
   at least one power semiconductor component (22) to be cooled, and wherein the power semiconductor component (22) is contacted through a conductor path for providing an electrical connection with an outer connection element (26) and internal connection elements (24) of an electronic circuit arrangement;
   a heat-conductive paste (30) providing an integral joint wherein the heat-conductive paste is disposed between the thermally conductive and electrically insulating substrate carrier and the power semiconductor component in a way of a layer for providing a transfer of heat from the power semiconductor component to the thermally conductive and electrically insulating substrate carrier such that the power semiconductor component (22) is disposed on the substrate carrier (16) through the integral joint.

2. The electronic circuit arrangement according to claim 1, wherein
   the heat-conductive paste layer (14) is a layer made of a mixture of suitable organic compounds with a defined portion of fillers, and wherein the heat-conductive paste layer (14) serves simultaneously as a good electrical insulator.

3. The electronic circuit arrangement according to claim 2, wherein
   the heat-conductive paste layer (14) is manufactured from an ester oil base including metal oxides as fillers.

4. The electronic circuit arrangement according to claim 1, further comprising
   a second foil;
   a heat-conductive and electrically conducting paste (30) for providing a transfer of low current and low heat from the power semiconductor component to the second foil, wherein the heat conductive and electrically conducting paste (30) is disposed on the power semiconductor component and includes a mixture of suitable organic compounds with a defined portion of fillers,
   and wherein the second foil (28) is disposed on the heat-conductive and electrically conducting paste (30).

5. The electronic circuit arrangement according to claim 4, wherein
   the heat-conductive and electrically conducting paste (30) is positioned at such points, wherein said points bring about a galvanic interconnection between the power semiconductor component and the second foil through pressure contact.

6. The electronic circuit arrangement according to claim 4, wherein
   the substrate carrier (16) and the second foil (28) are made of polyimide or polyester in form of flexible foils, wherein said foils in each case include at least one metal layer and wherein said metal layers are partially structured and properly sequenced.

7. The electronic circuit arrangement according to claim 6, wherein
   the partially structured metal layers, present on the flexible foils, are made of copper and include also a partial coating, and wherein the metal layers have differing layer thicknesses corresponding to electrical requirements.

8. The electronic circuit arrangement according to claim 7, wherein the partial coating is made of gold.

9. The electronic circuit arrangement according to claim 7, wherein the partial coating is made of silver.

10. The electronic circuit arrangement according to claim 7, wherein
    conductor paths of the structured metal layer of the foils are constructed to provide an integral joint connection directly to outer current connections.

11. The electronic circuit arrangement according to claim 7, wherein
    contact islands are provided in the structured metal layers of the foils, wherein integrally joined and positively engaged connection elements and other components as well as semiconductor and control components (22, 32) are contacted on the contact islands.

12. The electronic circuit arrangement according to claim 11, wherein
    a second integral joint is formed between a metal conductor path (34) and the outer connection element (26) by solder material (36) and the internal connection element (24).

13. The electronic circuit arrangement according to claim 11, wherein
    a second integral joint is formed directly between a contact surface of the semiconductor component (22) over the internal connection element (24) to the outer connection element (26) and over a second internal connection element (24) to the metal conductor path (34).

14. The electronic circuit arrangement according to claim 11, wherein
    a second integral joint is formed indirectly from the semiconductor component (22) through a first solder material (36), a metallic intermediate layer (38), a second solder material (36) to the metal conductor path (34).

15. The electronic circuit arrangement according to claim 11, wherein pressure contacts are mounted directly between metallizing layer of the foil and outer connection element (26) or component (22, 32) or indirectly through an electrically conducting paste (30).

16. The electronic circuit arrangement according to claim 11, wherein
    individual control components (32) are contacted on both sides with flexible conductor plates formed by the substrate carrier (16) and by the second flexible foil (28).

17. The electronic circuit arrangement according to claim 14, wherein
    the metallic intermediate layer (38) is formed of molybdenum and coated with a suitable galvanically or currentless metal coating.

18. An electronic circuit arrangement comprising
    a cooling component (12);

a paste layer (14) disposed on the cooling component (12); a substrate carrier (16) wherein the substrate carrier is disposed thermally conductive and electrically insulating on the cooling component (12) through the paste layer (].4) of defined geometry;

a heat conductive and electrically conducting paste layer disposed on the substrate carrier on a side opposite to a side where the paste layer (14) is disposed;

at least one power semiconductor component (22) having a semiconductor body wherein the semiconductor component to be cooled is disposed on the heat conductive and electrically conducting paste layer and thereby on the substrate carrier (16), and wherein heat from the semiconductor body is transferred to the cooling component through the substrate carrier, and wherein the power semiconductor component (22) to be cooled is electrically contacted with a conductor path.

19. The electronic circuit arrangement according to claim 18, wherein
the paste layer (14) is made of a mixture of organic compounds with fillers, and wherein the paste layer (14) is applied onto the cooling component (12) and serves as a good electrical insulator.

20. The electronic circuit arrangement according to claim 19, wherein
the paste layer (14) is produced of an ester oil base with metal oxides as fillers.

21. The electronic circuit arrangement according to claim 18 further comprising
a heat-conductive and electrically conducting paste (30) disposed on the power semiconductor component;
a second foil (28) disposed on the heat-conductive and electrically conducting paste (30), wherein the substrate carrier (16) and the second foil (28) are made of one of polyimide and polyester and formed as flexible conductor plates, wherein said conductor plates include at least one structured metal layer and electrical interconnections between a plurality of metal layers (40).

22. The electronic circuit arrangement according to claim 21, wherein
the structured metal layers, provided on the flexible conductor plates, are made of copper of differing layer thicknesses and partial coatings and wherein the structured metal layers form conductor paths.

23. The electronic circuit arrangement according to claim 22, wherein
the metal layers are made of gold.

24. The electronic circuit arrangement according to claim 22, wherein
the metal layers are made of silver.

25. The electronic circuit arrangement according to claim 22, wherein the conductor paths of the structured metal layers of the flexible conductor plate (16, 18) are formed to allow an integral joint connection directly to outer current connections.

26. The electronic circuit arrangement according to claim 21, wherein
contact islands are provided in the metal structure of the foils, wherein the integrally joined and positively engaged outer connection element (26) and semiconductor and control components (22, 32) are contacted on the contact islands.

27. The electronic circuit arrangement according to claim 26, wherein
the integral joint is produced between the metal conductor path (34) and the outer connection element (26) by solder material (36) and the internal connection element (24).

28. The electronic circuit arrangement according to claim 26, wherein
an integral joint is produced directly between a contact surface of the semiconductor component (22) over the internal connection element (24) to the outer connection element (26) and over a second internal connection element (24) to the metal conductor path (34).

29. The electronic circuit arrangement according to claim 26, wherein
the integral joint is produced indirectly from the semiconductor component (22) through a first solder material (36), a metallic intermediate layer (38), a second solder material (36) to the metal conductor path (34).

30. The electronic circuit arrangement according to claim 26, wherein
pressure contacts are mounted directly between metallizing layer of the foil and the outer connection element (26) or component (22, 32) or indirectly through an electrically conductive paste layer (30).

31. The electronic circuit arrangement according to claim 26, wherein
individual control components (32) are contacted on both sides with flexible conductor plates foraged by the substrate carrier (16) and by the second foil (28).

32. The electronic circuit arrangement according to claim 29, wherein the metallic intermediate layer (38) is formed of molybdenum and coated with a suitable galvanically or currentless metal coating.

33. An electronic circuit arrangement comprising
a cooling component;
a first heat-conductive paste layer of a defined thickness and geometry disposed on the cooling component;
a thermally conductive and electrically insulating substrate carrier disposed on the heat-conductive paste of a defined thickness and geometry and thereby indirectly on the cooling component, wherein the thermally conductive and electrically insulating substrate carrier is furnished by a form-stable and heat-resistant flexible foil, wherein the flexible foil is made of organic polymers and is further provided with structured metal laminate layers with alternatingly disposed foil and metal, and including metallic connections between two or more layers by means of metallic break-throughs; a second heat-conductive paste layer of a defined thickness and geometry disposed on the thermally conductive and electrically insulating substrate carrier;
at least one power semiconductor component to be cooled is disposed on the second heat-conductive paste layer of a defined thickness and geometry and thereby indirectly on the substrate carrier;
connection elements electrically connected to the power semiconductor component.

34. The electronic circuit arrangement according to claim 33 further comprising
a second thermally conductive and electrically insulating substrate carrier disposed on the power semiconductor component, wherein the thermally conductive and electrically insulating substrate carrier is furnished by a form-stable and heat-resistant flexible foil, wherein the flexible foil is made of organic polymers and is further provided with structured metal laminate layers with alternatingly disposed foil and metal, and including metallic connections between two or more layers by means of metallic break-throughs.

35. The electronic circuit arrangement according to claim 33 wherein the thermally conductive and electrically insulating substrate carrier includes a multilayer sequence of alternatingly foil and metal, and including metallic connections between two or more layers by means of metallic break-throughs.

36. The electronic circuit arrangement according to claim 33 wherein the connection elements are furnished as outer and proper sequenced necessary internal connection elements through connection surfaces to provide an electrical connection;

wherein the first heat-conductive paste layer of defined thickness and geometry and the second heat-conductive paste layer of defined thickness and geometry are provided in a layer mounting arrangement.

37. The electronic circuit arrangement according to claim 33 wherein the second heat-conductive layer is an electrically conducting layer.

* * * * *